(12) United States Patent
Takahashi et al.

(10) Patent No.: US 10,597,508 B2
(45) Date of Patent: Mar. 24, 2020

(54) ELECTROMAGNETIC WAVE SHIELDING MATERIAL AND LAYERED BODY FOR ELECTROMAGNETIC WAVE SHIELDING

(71) Applicant: SEKISUI CHEMICAL CO., LTD., Osaka, Osaka (JP)

(72) Inventors: Katsunori Takahashi, Osaka (JP); Kensuke Tsumura, Osaka (JP); Kazuhiro Sawa, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 270 days.

(21) Appl. No.: 14/443,593

(22) PCT Filed: Nov. 26, 2013

(86) PCT No.: PCT/JP2013/081777
§ 371 (c)(1),
(2) Date: May 18, 2015

(87) PCT Pub. No.: WO2014/087883
PCT Pub. Date: Jun. 12, 2014

(65) Prior Publication Data
US 2015/0337105 A1    Nov. 26, 2015

(30) Foreign Application Priority Data

Dec. 3, 2012  (JP) .................................. 2012-264503
Jul. 11, 2013  (JP) .................................. 2013-145185

(51) Int. Cl.
*C08K 3/04*      (2006.01)
*H05K 9/00*      (2006.01)
(Continued)

(52) U.S. Cl.
CPC .................. *C08K 3/04* (2013.01); *B32B 7/02* (2013.01); *B32B 27/08* (2013.01); *B32B 27/20* (2013.01);
(Continued)

(58) Field of Classification Search
CPC ........... B32B 7/02; B32B 27/20; B32B 27/08; B32B 27/32; H05K 9/0083; H05K 9/0088; H05K 9/0081; C08K 7/06; C08K 3/04
See application file for complete search history.

(56) References Cited

U.S. PATENT DOCUMENTS

2011/0088931 A1* 4/2011 Lettow .................. B82Y 30/00
                                                           174/257
2012/0128951 A1* 5/2012 Takahashi ............... B32B 27/12
                                                           428/213
(Continued)

FOREIGN PATENT DOCUMENTS

CN      102548760 A     7/2012
EP      2 752 293 A1    7/2014
(Continued)

OTHER PUBLICATIONS

Kalaitzidou et al. "A new compounding method for exfoliated graphite-polypropylene nanocomposites with enhanced flexural properties and lower percolation threshold". Composites Science and Technology, 67 (2007); pp. 2045-2051.*
(Continued)

*Primary Examiner* — Prashant J Khatri
(74) *Attorney, Agent, or Firm* — Cheng Law Group, PLLC

(57) ABSTRACT

There is provided an electromagnetic wave shielding material excellent in moldability and developing a good electromagnetic wave shielding function. The electromagnetic wave shielding material 1 contains a synthetic resin 11, and
(Continued)

an exfoliated graphite 12 being a layered body of graphene and having a number of graphene layers of 200 or smaller and an aspect ratio of 20 or higher.

11 Claims, 2 Drawing Sheets

(51) Int. Cl.
| | | |
|---|---|---|
| B32B 27/08 | (2006.01) | |
| B32B 27/32 | (2006.01) | |
| B32B 27/20 | (2006.01) | |
| B32B 7/02 | (2019.01) | |
| C08L 101/00 | (2006.01) | |
| C08K 7/06 | (2006.01) | |

(52) U.S. Cl.
CPC .............. *B32B 27/32* (2013.01); *C08K 3/042* (2017.05); *C08L 101/00* (2013.01); *H05K 9/0081* (2013.01); *H05K 9/0083* (2013.01); *H05K 9/0088* (2013.01); *B32B 2250/05* (2013.01); *B32B 2250/24* (2013.01); *B32B 2250/42* (2013.01); *B32B 2264/108* (2013.01); *B32B 2307/212* (2013.01); *B32B 2457/00* (2013.01); *B32B 2571/00* (2013.01); *C08K 7/06* (2013.01); *C08K 2201/011* (2013.01); *C08K 2201/016* (2013.01); *Y10T 428/2495* (2015.01)

(56) References Cited

U.S. PATENT DOCUMENTS

| | | |
|---|---|---|
| 2013/0096247 A1 | 4/2013 | Takahashi et al. |
| 2013/0120959 A1 | 5/2013 | Wano et al. |
| 2013/0126795 A1 | 5/2013 | Takahashi et al. |
| 2013/0225759 A1 | 8/2013 | Takahashi et al. |

FOREIGN PATENT DOCUMENTS

| | | | | |
|---|---|---|---|---|
| JP | 55-157300 | A | 12/1980 | |
| JP | 1-230299 | A | 9/1989 | |
| JP | 2-161800 | A | 6/1990 | |
| JP | 7-50837 | B2 | 5/1995 | |
| JP | 11-60969 | A | 3/1999 | |
| JP | 2002-252493 | A | 9/2002 | |
| JP | 2005-191384 | A | 7/2005 | |
| JP | 2008-266379 | A | 11/2008 | |
| JP | 2009-33113 | A | 2/2009 | |
| JP | 2010-34537 | A | 2/2010 | |
| JP | 2010-87372 | A | 4/2010 | |
| JP | 2011-18680 | A | 1/2011 | |
| JP | WO 2011040266 A1 | * | 4/2011 | ............. B32B 27/12 |
| JP | 2011-213090 | A | 10/2011 | |
| JP | 2011-249614 | A | 12/2011 | |
| JP | 2012-67202 | A | 4/2012 | |
| JP | 2012-77286 | A | 4/2012 | |
| KR | 10-2011-0018024 | A | 2/2011 | |
| KR | 10-2011-0045466 | A | 5/2011 | |
| KR | 10-2012-0081976 | A | 7/2012 | |
| TW | 201127625 | A1 | 8/2011 | |
| WO | WO-2011/158907 | A1 | 12/2011 | |

OTHER PUBLICATIONS

"Pro-fax 6301 Technical Datasheet". Lyondellbasel, pp. 1-3; Retrieved Jul. 8, 2017.*
"XGnP Graphene Nanoplatelets". XG Sciences, (2010); pp. 1-6.*
Li et al. "Surface modification of nano-SiO2 particles using polyaniline". Surface & Coatings Technology, 197, (2005); pp. 56-60.*
The First Office Action for the Application No. 201380042631.3 from The State Intellectual Property Office of the People's Republic of China dated May 24, 2017.
International Search Report for the Application No. PCT/JP2013/081777 dated Feb. 10, 2014.
Written Opinion of the International Searching Authority (PCT/ISA/237) for Application No. PCT/JP2013/081777 dated Feb. 10, 2014.
Written Opinion of the International Searching Authority (PCT/ISA/237) for Application No. PCT/JP2013/081777 dated Feb. 10, 2014 (English Translation dated Jun. 18, 2015).
Taiwanese Office Action for the Application No. 102144254 dated Apr. 17, 2017.
Supplementary European Search Report for the Application No. EP 13 86 1442 dated Jun. 10, 2016.
Notification of Reasons for Refusal for the Application No. 2013-555112 from Japan Patent Office dated Sep. 19, 2017.
Korean Office Action for Application No. 10-2015-7003691 dated Dec. 31, 2018.
Notification of Reasons for Refusal for the Application No. 2018-118467 from Japan Patent Office dated Jun. 11, 2019.
European Office Action for Application No. 13 861 442.5 dated Oct. 18, 2019.
Korean Office Action for Application No. 10-2015-7003691 dated Jun. 27, 2019.

* cited by examiner

[FIG. 1]
[FIG. 2]
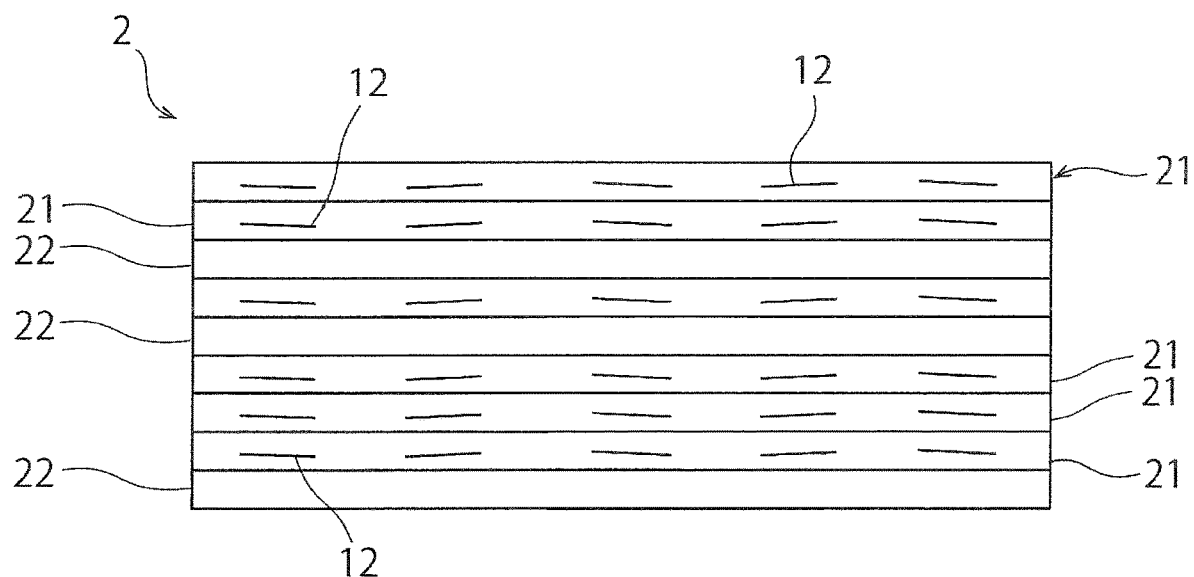

[FIG. 3]
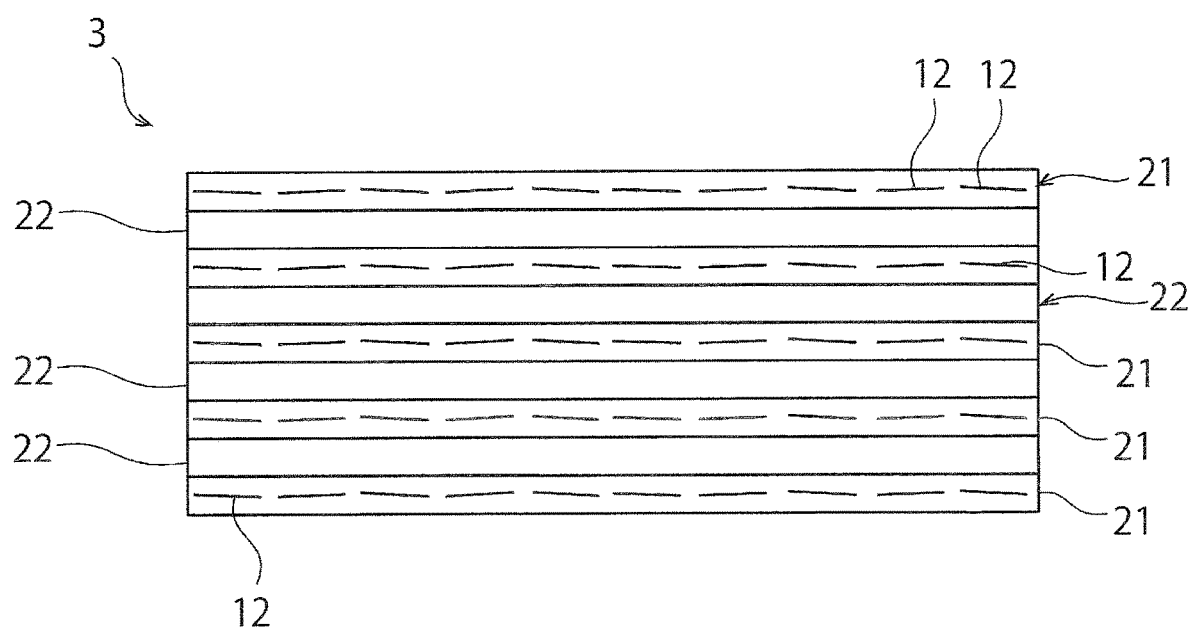

ELECTROMAGNETIC WAVE SHIELDING MATERIAL AND LAYERED BODY FOR ELECTROMAGNETIC WAVE SHIELDING

TECHNICAL FIELD

The present invention relates to an electromagnetic wave shielding material and a layered body for electromagnetic wave shielding which develop an electromagnetic wave shielding function, and particularly to an electromagnetic wave shielding material and a layered body for electromagnetic wave shielding in which a composite material comprising a synthetic resin and a carbon material is used.

BACKGROUND ART

Electromagnetic wave shielding materials have been conventionally used in a broad range of electronic devices in order to protect circuits and electronic component elements. For example, the following Patent Literature 1 discloses a composition for electromagnetic wave shielding in which metal nanoparticles are dispersed in a disperse medium composed of an organic solvent and the like.

The following Patent Literature 2 discloses an electromagnetic wave shielding material obtained by dispersing carbon nanotubes or fibrous carbon material in a synthetic resin.

CITATION LIST

Patent Literature

Patent Literature 1: Japanese Patent Laid-Open No. 2009-33113
Patent Literature 2: Japanese Patent Laid-Open No. 2005-191384

SUMMARY OF INVENTION

Technical Problem

A metal particle, a metal thin film, a metal powder or the like has been used in conventional electromagnetic wave shielding materials, as described in Patent Literature 1. In order to develop a sufficient electromagnetic wave shielding function, a large amount of such a metal material must be added. Hence, there arises a problem of low processability such as moldability of electromagnetic wave shielding materials.

Also in the electromagnetic wave shielding material in which a carbon nanotube or a fibrous carbon material is dispersed as described in Patent Literature 2, in order to sufficiently provide the electromagnetic wave shielding effect, a large amount of the carbon nanotube or the fibrous carbon material must be added. Therefore, there arises a problem of poor moldability.

It is an object of the present invention to provide an electromagnetic wave shielding material and a layered body for electromagnetic wave shielding, which enable the amount of an electroconductive material added to be small, enable the moldability to be enhanced, and enable to develop a sufficient electromagnetic wave shielding function.

Solution to Problem

The electromagnetic wave shielding material according to the present invention comprises a synthetic resin and an exfoliated graphite. The exfoliated graphite is a layered body of graphene, and has a number of graphene layers of 200 or smaller and an aspect ratio of 20 or higher.

In the electromagnetic wave shielding material according to the present invention, 1 to 30 parts by weight of the exfoliated graphite is preferably contained relative to 100 parts by weight of the synthetic resin. In this case, the electromagnetic wave shielding function can be enhanced more, and the moldability can be enhanced more.

In the electromagnetic wave shielding material according to the present invention, a standard deviation indicating a dispersion of angles in the longitudinal direction of the exfoliated graphite is preferably 20° or smaller. In this case, since the dispersion of angles in the longitudinal direction of the exfoliated graphite is small, the electromagnetic wave shielding function can be enhanced more.

In the electromagnetic wave shielding material according to the present invention, a thermoplastic resin is preferably used as the synthetic resin. In this case, the moldability can be enhanced more. As the synthetic resin, a polyolefinic resin is preferably used, and a polypropylenic resin is more preferably used. Since a polyolefinic resin such as a polypropylenic resin is inexpensive, the cost of an electromagnetic wave shielding material can be reduced.

The layered body for electromagnetic wave shielding according to the present invention comprises at least one layer of a first synthetic resin layer comprising an electromagnetic wave shielding material constituted according to the present invention, and at least one layer of a second synthetic resin layer laminated on the first synthetic resin layer and containing no exfoliated graphite.

In the layered body for electromagnetic wave shielding according to the present invention, the ratio (T1/T2) is preferably in the range of 1/10 to 10 where the total thickness of the first synthetic resin layer is taken as T1 and the total thickness of the second synthetic resin layer is taken as T2. In this case, a layered body good in the electromagnetic wave shielding function and enhanced in the moldability can be provided.

Preferably, the first synthetic resin layer and the second synthetic resin layer are alternately laminated. In this case, the moldability and the electromagnetic wave shielding function can be balanced highly. The number of laminated layers of the layered body in which the first synthetic resin layer and the second synthetic resin layer are alternately laminated is preferably 5 or larger. In the case where the number of laminated layers is 5 or larger, the electromagnetic wave shielding function can be enhanced more.

Advantageous Effects of Invention

The electromagnetic wave shielding material according to the present invention, because of using an exfoliated graphite having a number of graphene layers of 200 or smaller and an aspect ratio of 20 or higher, develops a sufficient electromagnetic wave shielding function even if the content of the exfoliated graphite is made low. Therefore, the relative content of the exfoliated graphite can be reduced, and thus the moldability and processability can be enhanced.

BRIEF DESCRIPTION OF DRAWINGS

FIG. 1 is a schematic cross-sectional view of an electromagnetic wave shielding material according to one embodiment of the present invention.

FIG. 2 is a schematic cross-sectional view of a layered body for electromagnetic wave shielding according to one embodiment of the present invention.

FIG. 3 is a schematic cross-sectional view of a layered body for electromagnetic wave shielding according to another embodiment of the present invention.

DESCRIPTION OF EMBODIMENTS

Hereinafter, the present invention will be clarified by interpreting specific embodiments according to the present invention.

(Synthetic Resin)

A synthetic resin to be used for the electromagnetic wave shielding material according to the present invention is not especially limited. A thermoplastic resin or a thermosetting resin can suitably be used. A thermoplastic resin can be preferably used because of being excellent in the moldability.

The thermoplastic resin is not especially limited, and there can be used one of various thermoplastic resins such as polyolefins, polyamides, polyesters, polystyrenes, polyvinyl chlorides and polyvinyl acetates. As the thermoplastic resin, there is preferably used a polyolefinic resin such as a polypropylene, a polyethylene, a random copolymer of ethylene and propylene, a block copolymer of ethylene and propylene, and a copolymer of ethylene and an α-olefin. There is more preferably used a polypropylenic resin, that is, a homopolymer of propylene, a copolymer of propylene and ethylene, or the like. The polypropylenic resin is generally used in various resin molded bodies, and is inexpensive. Further the polypropylenic resin can easily be molded at a relatively low temperature. Therefore, use of the polypropylenic resin enables to reduce the cost, and more enhance the moldability.

(Exfoliated Graphite)

An exfoliated graphite to be used in the present invention is a graphene layered body which is obtained by subjecting a graphite to an exfoliation treatment and is thinner than the original graphite. The number of graphene layers in the exfoliated graphite to be used in the present invention is several or larger and 200 or smaller, preferably several or larger and 100 or smaller, and more preferably several to about 10. The exfoliated graphite in which graphene is laminated in the above number has a shape having a relatively high aspect ratio. In the present invention, the aspect ratio of the exfoliated graphite is 20 or higher.

Therefore, the electromagnetic wave shielding material according to the present invention exhibits a good electromagnetic wave shielding function by dispersion of the exfoliated graphite in the synthetic resin in which the exfoliated graphite has a number of graphene layers of 200 or smaller and has an aspect ratio of 20 or higher. Further, even if the addition ratio of the exfoliated graphite is smaller, a sufficient electromagnetic wave shielding function is developed.

In the present invention, 1 to 30 parts by weight of the exfoliated graphite is preferably contained relative to 100 parts by weight of the synthetic resin, although the relative content of the exfoliated graphite is not especially limited. If it is in this range, a better electromagnetic wave shielding function can be developed and a higher moldability can be attained.

(Electromagnetic Wave Shielding Material)

In the electromagnetic wave shielding material according to the present invention, the above specific exfoliated graphite is dispersed in the above synthetic resin.

Further in the electromagnetic wave shielding material, fillers other than the exfoliated graphite may be dispersed. Such fillers include fillers composed of carbonaceous materials other than exfoliated graphite, such as carbon powders and CNT (carbon nanotubes), and inorganic fillers other than carbonaceous materials, such as alumina and calcium carbonate.

The physical shape of the electromagnetic wave shielding material is not especially limited. In the electromagnetic wave shielding material according to the present invention, since the addition ratio of the exfoliated graphite can be smaller, the moldability can be enhanced. Therefore, the electromagnetic wave shielding material according to the present invention can suitably be used in order to provide electromagnetic wave shielding materials of various shapes. Examples of such shapes include sheet-like materials and flat plate-like layered bodies in which a plurality of layers is laminated. The shape may be a cylindrical one, a spherical one, or a complicated shape according to applications.

By reference to FIG. 1 to FIG. 3, embodiments of the electromagnetic wave shielding material and the layered body for electromagnetic wave shielding according to the present invention will be described.

FIG. 1 is a schematic cross-sectional view showing an electromagnetic wave shielding material according to one embodiment of the present invention. An electromagnetic wave shielding material 1 shown in FIG. 1 has a sheet-like shape. In the electromagnetic wave shielding material 1, the above exfoliated graphite 12 is dispersed in a synthetic resin 11. Here, it is desirable that angles in the longitudinal direction of the exfoliated graphite 12 do not disperse. Preferably, the standard deviation a indicating a dispersion of angles in the longitudinal direction of the exfoliated graphite 12 is 20° or smaller. In other words, in the case where the angle of the average direction in the longitudinal directions of the whole exfoliated graphite with respect to both directions of the electromagnetic wave shielding material 1 is taken as X, it is desirable that the standard deviation a indicating a dispersion of angles in the longitudinal direction of the exfoliated graphite is 20° or smaller. In other words, it is desirable that the exfoliated graphite is dispersed so that the longitudinal directions of almost the whole exfoliated graphite are present in the range of X±20° (inclusive). In this case, the electromagnetic wave shielding function can be much higher.

FIG. 2 is a schematic cross-sectional view showing a layered body for electromagnetic wave shielding according to one embodiment of the present invention. A layered body for electromagnetic wave shielding 2 according to the present embodiment comprises at least one layer of a first synthetic resin layer 21, and at least one layer of a second synthetic resin layer 22 laminated on the first synthetic resin layer 21. The first synthetic resin layer 21 comprises the electromagnetic wave shielding material according to the present invention. Therefore, the above specific exfoliated graphite 12 is dispersed in a synthetic resin. On the other hand, the second synthetic resin layer 22 is a synthetic resin layer containing no exfoliated graphite. As a synthetic resin constituting the second synthetic resin layer 22, the above-mentioned suitable synthetic resin can be used. Preferably a thermoplastic resin, more preferably a polyolefinic resin, and still more preferably a polypropylenic resin are used. Thereby, the moldability can be much higher, and the cost can be much smaller.

It is more preferable that a synthetic resin constituting the first synthetic resin layer 21 and a synthetic resin constituting the second synthetic resin layer 22 are the same. In this case, the cost can be reduced more, and the adhesion strength of the first synthetic resin layer 21 and the second synthetic resin layer 22 can be enhanced.

A synthetic resin constituting the first synthetic resin layer 21 and a synthetic resin constituting the second synthetic resin layer 22 may be different resins. In this case, by making different the functions of the synthetic resin constituting the first synthetic resin layer 21 and the synthetic resin constituting the second synthetic resin layer 22, various functions can be developed. As the synthetic resin for the first synthetic resin or the second synthetic resin, for example, a synthetic resin having a high impact resistance, for example, an ABS resin, may be used. In this case, the impact resistance can be enhanced in the layered body for electromagnetic wave shielding.

The ratio (T1/T2) is desirably in the range of 1/10 to 10 where the total thickness of the first synthetic resin layer 21 is taken as T1, and the total thickness of the second synthetic resin layer 22 is taken as T2. In this case, in the layered body for electromagnetic wave shielding 2, since the first synthetic resin layer 21 becomes dominant, the electromagnetic wave shielding function can be much higher.

In the first synthetic resin layer 21, as in the above-mentioned electromagnetic wave shielding material, fillers other than the exfoliated graphite may be dispersed. The fillers are not especially limited, and include fillers other than the exfoliated graphite composed of carbonaceous materials such as carbon powders and carbon nanotubes, and other inorganic fillers such as calcium carbonate and silicon oxide. Also in the second synthetic resin layer 22, suitable fillers other than the exfoliated graphite may be blended.

The thicknesses of the first synthetic resin layer 21 and the second synthetic resin layer 22 are not especially limited; the thickness of the first synthetic resin layer 21 and the thickness of the second synthetic resin layer 2 may be different, or made identical.

FIG. 3 is a schematic cross-sectional view showing another embodiment of the layered body for electromagnetic wave shielding according to the present invention. In a layered body for electromagnetic wave shielding 3, the first synthetic resin layer 21 and the second synthetic resin layer 22 are alternately laminated. In the case where the first synthetic resin layer 21 and the second synthetic resin layer 22 are thus alternately laminated, the electromagnetic wave shielding function can be enhanced more, and the moldability can be much higher.

The number of laminated layers of the first synthetic resin layer 21 and the second synthetic resin layer 22 in the layered body for electromagnetic wave shielding according to the present invention is not especially limited, but the number is preferably 5 or larger, and is more preferably 7 or larger. The larger the number of layers, the better. By making the number of laminated layers large, the electromagnetic wave shielding function can be enhanced more. The number of laminated layers per mm of the thickness of the layered body for electromagnetic wave shielding is preferably 1,000 or smaller. This is because the fabrication of a layered body for electromagnetic wave shielding whose number of laminated layers per mm in thickness is larger than 1,000 is difficult in manufacture.

As described before, the physical shape of the electromagnetic wave shielding material according to the present invention is not limited to such a sheet-like shape or such a layered body obtained by laminating a plurality of layers.

(Manufacturing Method)

A manufacturing method of the electromagnetic wave shielding material according to the present invention is not especially limited, and may involve kneading a raw material containing the above synthetic resin and the above specific exfoliated graphite, and shaping the mixture by a suitable method. The shaping method is not especially limited, and a suitable molding method such as melt extrusion or solution casting can be used.

An example thereof includes a method in which the above exfoliated graphite is kneaded in a synthetic resin by using a suitable kneader, and the mixture is extruded and molded under heating by using a twin-screw extruder or the like. Alternatively, not exfoliated graphite but graphite or expanded graphite may be used as a raw material. The expanded graphite or graphite is kneaded with a synthetic resin such as a thermoplastic resin under heating. In this case, by the melt kneading under heating, the exfoliation of graphene layers proceeds in the expanded graphite or graphite raw material. The exfoliated graphite is resultantly homogeneously dispersed in the melt kneaded material. Therefore, the shaping can provide an electromagnetic wave shielding material. Here, the expanded graphite can be obtained by an electrochemical method in which electrolytic ions such as nitrate ions are intercalated between layers of graphite, or the like.

The layered body for electromagnetic wave shielding according to the present invention can be obtained by a method of coextruding and molding each resin composition constituting the first synthetic resin layer and the second synthetic resin layer. A specific method of obtaining such a layered body is not especially limited, and there can suitably be used, for example, a wet lamination method, a dry lamination method, an extrusion coating method, a multilayer melt extrusion method, a hot melt lamination method, or a heat lamination method.

Preferably, as the manufacturing method, a multilayer melt extrusion method, which is easy in manufacture of the layered body for electromagnetic wave shielding according to the present invention, can be used. Examples of the multilayer melt extrusion method include a multi-manifold method and a feed block method.

An example of a manufacturing method of the layered body for electromagnetic wave shielding by using the above feed block method includes a method described below. A first and second synthetic resin compositions are introduced to a first extruder and a second extruder, respectively, and simultaneously extruded from the first extruder and the second extruder. The first and second synthetic resin compositions extruded from the first and second extruders are fed to a feed block. In the feed block, the first and second synthetic resin compositions merge. Thereby, a layered body in which a first synthetic resin layer and a second synthetic resin layer are laminated can be obtained.

The layered body is transferred to a multilayer forming block, and is multilayered in the multilayer forming block to be thereby able to obtain a layered body for electromagnetic wave shielding having 10 or more layers.

Here, the multilayer molding is not limited to the above method, and can be carried out by a suitable multilayering method and apparatus. A layered body for electromagnetic wave shielding may be obtained, for example, by multilayering by repeatedly folding back the above-mentioned layered body for electromagnetic wave shielding.

Hereinafter, the present invention will be clarified by way of specific Examples of the present invention. Here, the present invention is not limited to the following Examples.

Example 1

83 parts by weight of a polypropylenic resin (manufactured by Japan Polypropylene Corp., item number: EA9) and 17 parts by weight of an exfoliated graphite (manufactured by XG Sciences, Inc., item number: XGnP-H5, the number of graphene layers: 180, aspect ratio: 100) were melt kneaded, and press molded to thereby obtain a 2 mm-thick resin plate-like electromagnetic wave shielding material. The electromagnetic wave shielding effect of the electromagnetic wave shielding material was measured by the following KEC method. The shielding effect at a frequency of 10 MHz was 10 dB.

KEC method: KEC Electronic Industry Development Center Method

Measurement jig: a cell for electric field shielding effect evaluation

Measurement means: a sample was inserted between a signal transmitting and receiving antennas, and the intensity of the electromagnetic field was measured. Besides, the electromagnetic field intensity in the case where no sample was inserted was measured. The measurement frequency was made to be 100 kHz to 1 GHz. The amount of attenuation when the measurement sample was inserted was indicated in decibel (dB) with the electromagnetic field intensity in the case where no sample was inserted as a reference.

Example 2

A resin plate-like electromagnetic wave shielding material was obtained by the same method as in Example 1, except for altering the polypropylenic resin to 99.2 parts by weight and the exfoliated graphite to 0.8 parts by weight. The electromagnetic wave shielding effect of the electromagnetic wave shielding material was measured. The shielding effect at a frequency of 10 MHz was 4 dB.

Comparative Example 1

A 2 mm-thick resin plate-like electromagnetic wave shielding material composed of 100 parts by weight of the polypropylenic resin used in Example 1 was obtained. The electromagnetic wave shielding effect of the electromagnetic wave shielding material was measured. The shielding effect at a frequency of 10 MHz was lower than 1 dB.

Comparative Example 2

A 2 mm-thick resin plate-like electromagnetic wave shielding material was obtained as in Example 1, except for using a graphite powder (manufactured by SEC Carbon, Ltd., item number: SNO-5, the number of graphene layers: 1,500, aspect ratio: 10) in place of the exfoliated graphite. The shielding effect at a frequency of 10 MHz of the electromagnetic wave shielding material was 1 dB.

Comparative Example 3

A 2 mm-thick resin plate-like electromagnetic wave shielding material was obtained as in Example 1, except for using a carbon fiber (manufactured by Toray Industries, Inc., item number: Torayca T010-003, fiber diameter: 7 μm, length: 3 mm) in place of the exfoliated graphite. The shielding effect at a frequency of 10 MHz of the electromagnetic wave shielding material was 1 dB.

Example 3

A 1 mm-thick resin plate composed of 83 parts by weight of the polypropylenic resin (manufactured by Japan Polypropylene Corp., item number: EA9) and 17 parts by weight of the exfoliated graphite (manufactured by XG Sciences, Inc., item number: XGnP-H5, the number of graphene layers: 180, aspect ratio: 100) was thermally fused and laminated on each of both surfaces of a 1 mm-thick resin plate composed of 100 parts by weight of the polypropylenic resin (manufactured by Japan Polypropylene Corp., item number: EA9). Thereby, a 3 mm-thick layered body for electromagnetic wave shielding was obtained. The electromagnetic wave shielding effect at a frequency of 10 MHz of the obtained layered body for electromagnetic wave shielding was 20 dB.

Example 4

A 3 mm-thick layered body for electromagnetic wave shielding was obtained as in Example 3, except for using an exfoliated graphite (manufactured by XG Sciences, Inc., item number: XGnP-M5, the number of graphene layers: 90, aspect ratio: 200) whose number of graphene layers was 90 in place of the exfoliated graphite whose number of graphene layers was 180. The shielding effect at a frequency of 10 MHz of the obtained layered body for electromagnetic wave shielding was 30 dB.

Example 5

A 0.3 mm-thick resin plate B composed of 100 parts by weight of the polypropylenic resin (manufactured by Japan Polypropylene Corp., item number: EA9) and a 0.5 mm-thick resin plate A composed of 83 parts by weight of the polypropylenic resin (manufactured by Japan Polypropylene Corp., item number: EA9) and 17 parts by weight of the exfoliated graphite (manufactured by XG Sciences, Inc., item number: XGnP-H5, the number of graphene layers: 180, aspect ratio: 100) were thermally fused and alternately laminated as ABABABA to thereby obtain a 3.2 mm-thick 2-kind 7-layer layered body. The shielding effect at a frequency of 10 MHz of the obtained layered body for electromagnetic wave shielding was 80 dB. Additionally, the electromagnetic wave shielding effect at a frequency of 100 MHz was 40 dB, and that at a frequency of 1,000 MHz was 20 dB.

Comparative Example 4

A 3 mm-thick layered body for electromagnetic wave shielding was obtained as in Example 3, except for using the graphite powder (manufactured by SEC Carbon, Ltd., item number: SNO-5, the number of graphene layers: 1,500, aspect ratio: 10) in place of the exfoliated graphite. The shielding effect at a frequency of 10 MHz of the obtained layered body for electromagnetic wave shielding was 1 dB.

Comparative Example 5

A 3 mm-thick layered body for electromagnetic wave shielding was obtained as in Example 3, except for using the carbon fiber (manufactured by Toray Industries, Inc., item number: Torayca T010-003, fiber diameter: 7 μm, length: 3 mm) in place of the exfoliated graphite. The shielding effect at a frequency of 10 MHz of the obtained layered body for electromagnetic wave shielding was lower than 1 dB.

REFERENCE SIGNS LIST

1 ELECTROMAGNETIC WAVE SHIELDING MATERIAL
2, 3 LAYERED BODY FOR ELECTROMAGNETIC WAVE SHIELDING
11 SYNTHETIC RESIN
12 EXFOLIATED GRAPHITE
21 FIRST SYNTHETIC RESIN LAYER
22 SECOND SYNTHETIC RESIN LAYER

The invention claimed is:

1. A layered body for electromagnetic wave shielding comprising:
   at least four layers of a first synthetic resin layer comprising an electromagnetic wave shielding material; and
   at least one layer of a second synthetic resin layer laminated on the first synthetic resin layer and containing no exfoliated graphite,
   wherein the electromagnetic wave shielding material comprises:
   a synthetic resin; and
   an exfoliated graphite being a layered body of graphene and having a number of graphene layers of 200 or smaller and an aspect ratio of 20 or higher,
   wherein a standard deviation 6 indicating a dispersion of angles in a longitudinal direction of the exfoliated graphite is 20° or smaller,
   wherein the first synthetic resin layer and the second synthetic resin layer comprise the same synthetic resin,
   wherein T1/T2 is in a range of 1/10 to 10 where T1 is a sum of thicknesses of all of the first synthetic resin layers and T2 is a sum of thicknesses of all of the at least one layers of the second synthetic resin layer; and,
   wherein the layered body has at least a portion in which the first synthetic resin layer and the second synthetic resin layer are alternately laminated.

2. The layered body for electromagnetic wave shielding according to claim 1, wherein 1 to 30 parts by weight of the exfoliated graphite is contained relative to 100 parts by weight of the synthetic resin.

3. The layered body for electromagnetic wave shielding according to claim 1, wherein the synthetic resin is a thermoplastic resin.

4. The layered body for electromagnetic wave shielding according to claim 3, wherein the synthetic resin is a polyolefinic resin.

5. The layered body for electromagnetic wave shielding according to claim 4, wherein the polyolefinic resin is a polypropylenic resin.

6. The layered body for electromagnetic wave shielding according to claim 1, wherein the first synthetic resin layer and the second synthetic resin layer are alternately laminated.

7. The layered body for electromagnetic wave shielding according to claim 6, wherein the layered body having the first synthetic resin layer and the second synthetic resin layer alternately laminated has a number of laminated layers of 7 or larger.

8. The layered body for electromagnetic wave shielding according to claim 1, wherein the first synthetic resin layer further comprises silicon oxide.

9. The layered body for electromagnetic wave shielding according to claim 8, wherein the second synthetic resin layer further comprises a filler.

10. The layered body for electromagnetic wave shielding according to claim 1 wherein at least one of the first synthetic resin layer and the second synthetic resin layer further comprises a filler selected from the group consisting of carbon powders and carbon nanotubes.

11. The layered body for electromagnetic wave shielding according to claim 1 wherein at least one of the first synthetic resin layer and the second synthetic resin layer further comprises an inorganic filler selected from the group consisting of alumina, calcium carbonate, and silicon oxide.

* * * * *